(12) United States Patent
Tadele et al.

(10) Patent No.: US 12,127,344 B2
(45) Date of Patent: Oct. 22, 2024

(54) CIRCUIT BOARD INTERCONNECTION DEVICE AND CIRCUIT BOARD ASSEMBLY

(71) Applicant: BorgWarner Inc., Auburn Hills, MI (US)

(72) Inventors: Sisay Tadele, Friolzheim (DE); Riza Oguz, Esslingen a. N. (DE); Alexander Dauth, Maulbronn (DE); Michael Krappel, Stuttgart (DE); Michael Degendorfer, Schwaikheim (DE)

(73) Assignee: BorgWarner Inc., Auburn Hills, MI (US)

( * ) Notice: Subject to any disclaimer, the term of this patent is extended or adjusted under 35 U.S.C. 154(b) by 0 days.

(21) Appl. No.: 17/506,881

(22) Filed: Oct. 21, 2021

(65) Prior Publication Data

US 2023/0056822 A1 Feb. 23, 2023

(30) Foreign Application Priority Data

Aug. 18, 2021 (DE) ......................... 102021121465.3

(51) Int. Cl.
*H05K 1/14* (2006.01)
*H05K 3/36* (2006.01)

(52) U.S. Cl.
CPC .............. *H05K 1/141* (2013.01); *H05K 3/36* (2013.01); *H05K 2201/09754* (2013.01); *H05K 2201/10325* (2013.01); *H05K 2201/10977* (2013.01)

(58) Field of Classification Search
CPC .......... H05K 2201/08754; H05K 2201/10325; H05K 2201/09754; H05K 2201/10189; H05K 2201/10378; H05K 2201/10977
See application file for complete search history.

(56) References Cited

U.S. PATENT DOCUMENTS

| | | | | |
|---|---|---|---|---|
| 3,701,075 A | * | 10/1972 | Schullstrom | H05K 7/10 439/70 |
| 3,846,740 A | * | 11/1974 | Damon | H05K 7/1015 439/70 |
| 4,641,426 A | * | 2/1987 | Hartman | H01R 12/58 228/180.1 |
| 4,686,607 A | * | 8/1987 | Johnson | H01R 12/716 361/791 |
| 4,703,394 A | * | 10/1987 | Petit | H01R 12/737 361/803 |
| 5,240,422 A | * | 8/1993 | Kobayashi | H01R 13/41 439/82 |

(Continued)

*Primary Examiner* — Paresh Paghadal
(74) *Attorney, Agent, or Firm* — Howard & Howard Attorneys PLLC (57) ABSTRACT

A printed circuit board connecting device (1) for connecting printed circuit boards (3, 5) includes a non-conductive plate (21) having a top side and a bottom side, and a plurality of interface connections (23) which are arranged in the plate (21) so as to be spaced apart from one another. Each interface connection (23) has grouped-together conductors (41) which extend through the plate (21) and which are laterally enclosed by the plate material and the end regions of which protruding on the top side and lower side from the plate (21) can be fixed to interfaces (13) of two printed circuit boards (3, 5) to be connected. Therefore, the conductors (41) form both a mechanical and an electrical connection between the interfaces (13) of the printed circuit boards (3, 5).

12 Claims, 3 Drawing Sheets

(56) References Cited

U.S. PATENT DOCUMENTS

| | | | | | |
|---|---|---|---|---|---|
| 5,352,123 | A * | 10/1994 | Sample | H05K 7/1445 | 439/61 |
| 5,800,184 | A * | 9/1998 | Lopergolo | H05K 7/1069 | 439/862 |
| 5,831,814 | A * | 11/1998 | Hamill | H01R 9/2458 | 361/627 |
| 6,116,916 | A * | 9/2000 | Kasai | H01R 9/226 | 361/826 |
| 6,224,397 | B1 * | 5/2001 | Nakamura | H01R 9/24 | 439/949 |
| 6,700,795 | B1 * | 3/2004 | Jones | H05K 1/141 | 361/826 |
| 6,773,269 | B1 * | 8/2004 | Downes | H05K 3/368 | 439/55 |
| 6,781,845 | B2 * | 8/2004 | Chang | H05K 3/368 | 439/74 |
| 6,816,486 | B1 * | 11/2004 | Rogers | H05K 7/1445 | 340/2.21 |
| 7,086,871 | B2 * | 8/2006 | Park | H01R 12/716 | 439/78 |
| 7,172,439 | B1 * | 2/2007 | Yokobatake | H05K 1/141 | 29/829 |
| 7,740,489 | B2 * | 6/2010 | Trout | H01R 12/523 | 439/74 |
| 7,752,788 | B1 * | 7/2010 | Sun | H01R 12/716 | 439/78 |
| 7,837,496 | B1 * | 11/2010 | Pal | H01R 9/2466 | 439/485 |
| 7,983,024 | B2 * | 7/2011 | Harris, IV | H01H 85/046 | 361/833 |
| 8,475,183 | B2 * | 7/2013 | Chien | H01R 12/585 | 439/78 |
| 9,033,716 | B2 | 5/2015 | Sloey et al. | | |
| 9,655,256 | B2 * | 5/2017 | Lindner | H05K 1/144 | |
| 11,152,755 | B2 * | 10/2021 | Naka | H01R 13/504 | |
| 2005/0032398 | A1 * | 2/2005 | Perret | H05K 7/1452 | 439/67 |
| 2005/0073819 | A1 * | 4/2005 | McCubbrey | G06F 30/34 | 361/803 |
| 2006/0134945 | A1 * | 6/2006 | Kuo | H01R 12/728 | 439/74 |
| 2006/0141825 | A1 * | 6/2006 | Nakagawa | H05K 3/301 | 439/78 |
| 2006/0240641 | A1 * | 10/2006 | Lauffer | H05K 3/462 | 438/455 |
| 2007/0111600 | A1 * | 5/2007 | Tokunaga | H01R 13/6585 | 439/607.01 |
| 2007/0218710 | A1 * | 9/2007 | Brown | H05K 3/4092 | 439/66 |
| 2008/0207015 | A1 * | 8/2008 | Sueyoshi | H05K 3/325 | 439/75 |
| 2009/0020332 | A1 * | 1/2009 | Sano | H01R 12/7082 | 361/803 |
| 2010/0029103 | A1 * | 2/2010 | Costello | H05K 13/0015 | 439/75 |
| 2011/0080718 | A1 * | 4/2011 | Koide | H01L 23/49827 | 438/118 |
| 2011/0151688 | A1 * | 6/2011 | Beaman | H01R 13/2407 | 439/66 |
| 2012/0058680 | A1 * | 3/2012 | Pan | H01R 31/06 | 439/626 |
| 2012/0244823 | A1 * | 9/2012 | Scharf | G06F 1/185 | 29/857 |
| 2014/0133122 | A1 * | 5/2014 | Hoffmeyer | H01R 43/205 | 29/832 |
| 2016/0020546 | A1 * | 1/2016 | Kaesser | H01R 43/18 | 29/825 |
| 2017/0117648 | A1 * | 4/2017 | Juanes Ribas | H01R 12/58 | |
| 2018/0247768 | A1 * | 8/2018 | Koini | H01G 4/248 | |
| 2019/0080931 | A1 * | 3/2019 | Ito | H01L 21/565 | |
| 2020/0127399 | A1 * | 4/2020 | Chou | H01R 13/405 | |
| 2020/0229305 | A1 * | 7/2020 | Elsing | H05K 1/144 | |
| 2020/0381981 | A1 * | 12/2020 | Kobayashi | F04B 39/14 | |

* cited by examiner

CIRCUIT BOARD INTERCONNECTION DEVICE AND CIRCUIT BOARD ASSEMBLY

CROSS REFERENCE TO RELATED APPLICATION

The present application claims priority to and all the benefits of German Patent Application No. 102021121465.3, filed Aug. 18, 2021, the disclosure of which is expressly hereby incorporated herein by reference in its entirety.

TECHNICAL FIELD

The invention relates to a printed circuit board connecting device for connecting printed circuit boards and to a printed circuit board arrangement comprising two printed circuit boards and such a printed circuit board connecting device.

BACKGROUND

In the case of a conventional connection of two printed circuit boards, so that they run substantially parallel to one another, a plurality of separate devices are used for connection purposes. The printed circuit boards have a plurality of interfaces at various positions. Between the interfaces of the two printed circuit boards, a separate interface connection is provided at each position. In addition, spacers are required in regions without interface connections in order to support the printed circuit boards. In the case of such a printed circuit board arrangement, it is difficult to observe the predefined mounting tolerances owing to the multiplicity of components for connecting the printed circuit boards. Electrothermal aspects may also prove critical and be detrimental to the quality. Another approach with a setup having an additional printed circuit board would, however, be accompanied by increased complexity and cost disadvantages.

U.S. Pat. No. 9,033,716 B2 discloses a connecting means for printed circuits or printed circuit boards.

The object is to provide an improved connecting device for connecting two printed circuit boards and a printed circuit board arrangement comprising two connected printed circuit boards.

The object is achieved by the printed circuit board connecting device having the features of claim 1 and a printed circuit board arrangement comprising such a printed circuit board connecting device.

SUMMARY OF THE INVENTION

The printed circuit board connecting device for connecting printed circuit boards comprises a non-conductive plate having a top side and a bottom side, and also a plurality of interface connections which are arranged in the plate so as to be spaced apart from one another. Each interface connection has grouped-together conductors which extend through the plate and which are laterally enclosed by the plate material and the end regions of which protruding on the top side and lower side from the plate can be fixed to interfaces of two printed circuit boards to be connected, and therefore the conductors form both a mechanical and an electrical connection between the interfaces of the printed circuit boards. The printed circuit board connecting device is configured to connect at least two printed circuit boards so that a layered printed circuit board arrangement is formed, the printed circuit boards of which are arranged above and below the printed circuit board connecting device, with the result that the printed circuit boards and the printed circuit board connecting device extend in a substantially parallel manner. In the printed circuit board arrangement, the printed circuit board connecting device connects a bottom side of the printed circuit board arranged on the top side of the printed circuit board connecting device to a top side of the printed circuit board arranged on the bottom side of the printed circuit board connecting device. In the following text, the expressions "top side" and "bottom side" are also denoted as a first main side and an opposite second main side, respectively, of the plate-like printed circuit board connecting device. Similar expressions such as "at the top"/"at the bottom" or "on the top side"/"on the bottom side" refer to the defined "top side" and "bottom side" of the printed circuit board connecting device. The expressions are only to be understood relative to one another and do not denote an absolute position in space. In spite of these expressions, the printed circuit board connecting device and the printed circuit board arrangement comprising it can of course be operated in a vertical or oblique position, in which the first side and the second side of the printed circuit board connecting device are regarded as "top side" and "bottom side", respectively.

The printed circuit board connecting device is configured to connect a plurality of corresponding interfaces of at least two printed circuit boards by way of a single device, in which a plurality of interface connections are integrated. Corresponding interfaces are the two interfaces on different printed circuit boards, which are connected and are arranged in opposing fashion in the printed circuit board arrangement. The printed circuit board connecting device reduces the complexity of the mounting process when connecting two printed circuit boards, since the number of components required for the connection is significantly reduced and makes it possible to connect larger printed circuit boards. Instead of three printed circuit boards connected in a conventional manner, only two printed circuit boards are required. The reduced complexity of the mounting process is accompanied by reduced expenditure in terms of time and cost.

The conductors fixed in the plate by the plate material are both electrically and mechanically connected to the interfaces. This can be effected, for example, by a force-fitting connection or by a form-fitting connection or by a materially bonded connection. The force-fitting connection may arise from the friction of components which fit into one another, or it may comprise female connector elements. The materially bonded connection may be effected by soldering.

The conductors advantageously run in the direction of the surface normal through the plate and are laterally enclosed by the plate material, with the result that the encapsulated conductors are fixed in the plate. The end regions of the conductors, which end regions protrude beyond the plate top side and the plate bottom side, serve as connection terminals.

The printed circuit board connecting device is an integrated approach for the electro-mechanical connection between two printed circuit boards, such that a printed circuit board arrangement comprising a connecting device which is integrated in a single device and which forms both electrical and thermal and mechanical connections can be formed. At least one of the printed circuit boards to be connected may be a printed circuit board for which conventional connection methods for electrical contacting are not possible, such as for example press-fit contacts in the case of IMS printed circuit boards ("IMS" standing for "insulated metal substrate" and being a metal core printed circuit board) or printed circuit boards with ceramic substrates. The printed circuit board connecting device also meets high thermomechanical requirements. The printed circuit board connecting device is a leadframe unit comprising a plurality of interface connections which are integrated in the insulating plate and which allow two or more printed circuit boards to be combined in a stable stack. Such a printed circuit board connecting device simplifies the mounting process during the connection of at least two printed circuit boards. Moreover, in addition to the secure fixing of the printed circuit boards, it also enables good fixing to the housing in which the printed circuit board arrangement is installed.

Means for fixing and positioning and also electrically acting means for grounding and shielding may be provided on the printed circuit board connecting device. The printed circuit board connecting device and the printed circuit board arrangement can withstand high vibrational loads and thermal expansions of the terminals, which is accompanied by increased reliability in high power systems that are subjected to thermal stress.

The printed circuit board connecting device and the printed circuit board arrangement also afford advantages in terms of the packing size of the printed circuit board arrangement. There are further advantages in terms of the mechanical load-bearing capacity for vibrations and thermal expansion, the robustness of the electrical connections in relation to vibrations and thermal expansion, the observance of required tolerances during mounting and the service life of the devices. Overall, the printed circuit board arrangement as a whole is more robust than a conventional arrangement.

In one embodiment of the printed circuit board connecting device, the conductors are configured as pin contacts. The end regions of the pin contacts are plug pins which project from the plate and which can be fixed in sockets of the printed circuit boards. The plug pin-socket connections allow both an electrical connection and a mechanical fixing. Alternative connections are for example solder connections, in which the end regions, which are configured as solder contacts, are soldered to the interfaces. In the case of the solder contacts, the pin-like end regions are angled.

In one embodiment, the conductors are connected to the plate in a form-fitting and/or materially bonded manner in order to form a robust printed circuit board connecting device. In the printed circuit board connecting device, the conductors, which form the contacts to the interfaces, are encapsulated by the plate material. The form-fitting connection is achieved by a change in cross section in the region of the conductor which is encapsulated. The materially bonded connection is advantageously a metal-plastic connection, which is produced during manufacture by the curing plastic which encloses the metallic conductors.

In one embodiment, the interface connections are each defined by an upwardly projecting base and an opposite downwardly projecting base in the plate. The base is a thickened plate portion which assists the fixing of the conductors in the plate. The base may also serve as a stop for the interfaces which are connected to the interface connection. The bases are arranged in the printed circuit board arrangement at the positions of the corresponding interfaces.

In one embodiment, the plate is configured as a plastics molded part, for example an injection-molded part, in which the conductors are encapsulated by the plate material.

In one embodiment, the printed circuit board connecting device also has a metallic sleeve which extends through the plate and which is laterally surrounded by the plate material, in particular can be encapsulated. The metallic sleeve enables an electrically conductive connection between the printed circuit boards and the printed circuit board connecting device, with the result that electromagnetically compatible installation of the device is made possible.

In one embodiment, the plate of the printed circuit board connecting device has spacers which protrude on the top side and/or on the bottom side and which predefine the distance between the printed circuit boards and support the printed circuit boards. The spacers are integrated in the plate and formed integrally with the plate. The plate may comprise, on the top side and/or bottom side, aligning means which are configured to align at least one of the printed circuit boards to be connected in a predefined position. During the mounting process, the aligning means direct the printed circuit boards into a predefined position and hold them there. The aligning means may be configured as cutouts or regions which protrude into the printed circuit board. Projecting plate regions which serve both as spacers and as aligning means are possible. The spacers and aligning means can be designed in manifold ways. They may be, for example, cylindrical or dome-like encapsulated regions of the plate.

In one embodiment, the printed circuit board arrangement comprising two printed circuit boards and a printed circuit board connecting device comprises an IMS printed circuit board and/or an FR4 printed circuit board. Advantageously, an IMS printed circuit board and an FR4 printed circuit board are connected to one another in the printed circuit board arrangement, for which conventional connection techniques are not suitable. Separate spacers between the IMS printed circuit board and the FR4 printed circuit board are then not necessary. An additional printed circuit board, as in the case of conventional connections, is not required. Additional plastic clamps for aligning three phase contacts with tulip contacts are also not required. The printed circuit boards advantageously have interfaces with sockets which are connected to the plug pins of the interface connections, and therefore the conductors form both a mechanical and an electrical connection between interfaces of the printed circuit boards. For secure fixing, merely a screw is required, advantageously in each corner through the printed circuit boards and the printed circuit board connecting device.

In one embodiment, the printed circuit boards have continuous cutouts which are configured as holes and the position of which corresponds to the position of the metallic sleeve. The cutouts and the sleeve are configured such that a connecting means, in particular a screw, can be guided through the cutouts and the sleeve. Further connections for the electromagnetic compatibility of the printed circuit board arrangement are not necessary.

In one embodiment, at least one of the printed circuit boards has a component which projects in the direction of the printed circuit board connecting device and which extends through a cutout in the printed circuit board connecting device. This results in a compact structure of the printed circuit board arrangement. In association therewith, the printed circuit board connecting device may have a shape which deviates considerably from a rectangular basic shape and which may have a plurality of holes in the interior space and/or finger-like regions, formed by edge-side cutouts.

BRIEF DESCRIPTION OF THE FIGURES

Exemplary embodiments will be explained in more detail below with reference to the drawing, in which.

DETAILED DESCRIPTION

In the figures, components that are identical or have the same effect are provided with the same reference designations.

Figure 1:
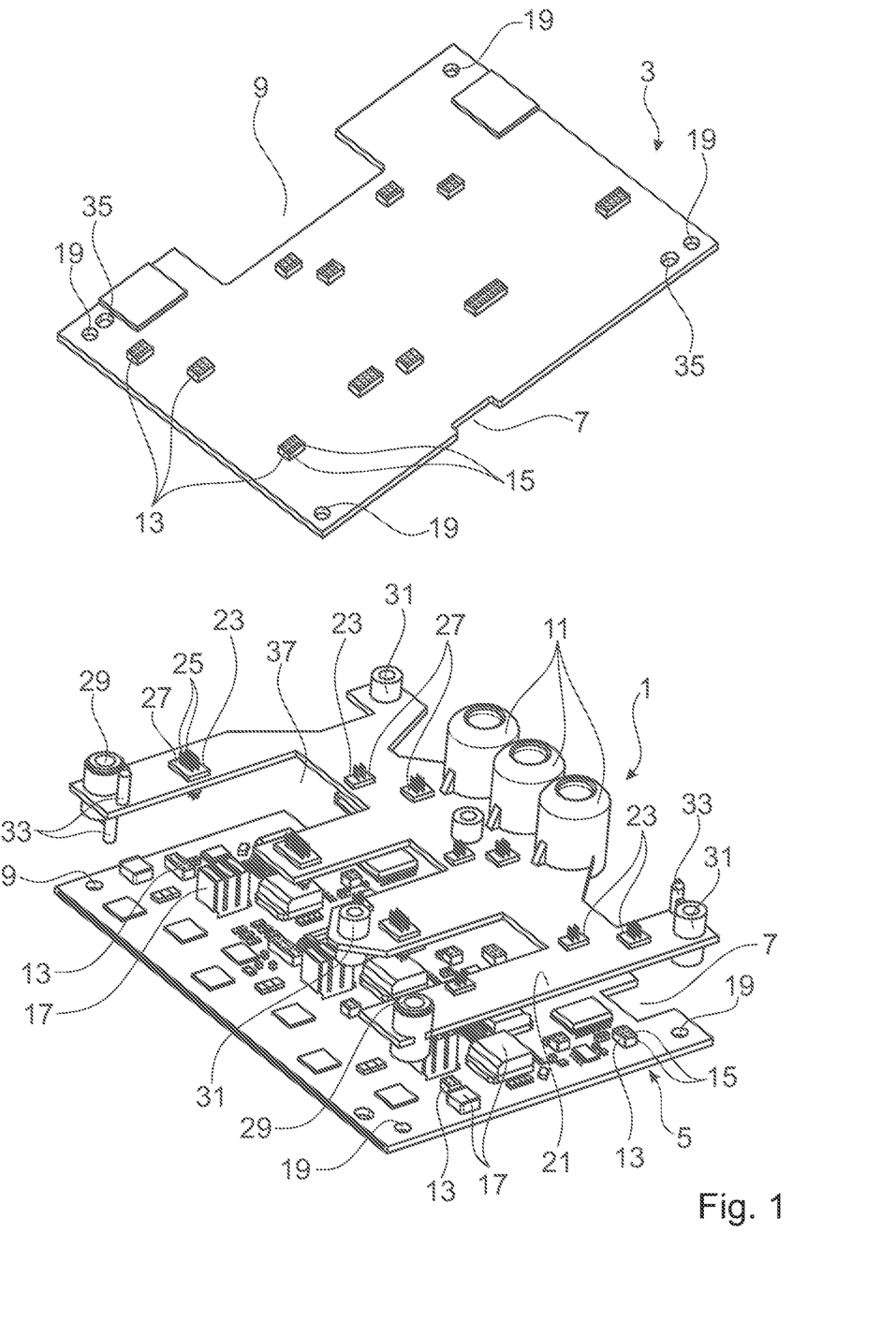
FIG. 1 shows a three-dimensional view of exemplary embodiments of a printed circuit board connecting device and two printed circuit boards.

FIG. 1 shows a three-dimensional view of exemplary embodiments of a printed circuit board connecting device 1 and two printed circuit boards 3, 5 ("PCBs" for short), which can be connected to form a printed circuit board arrangement.

Figure 2:
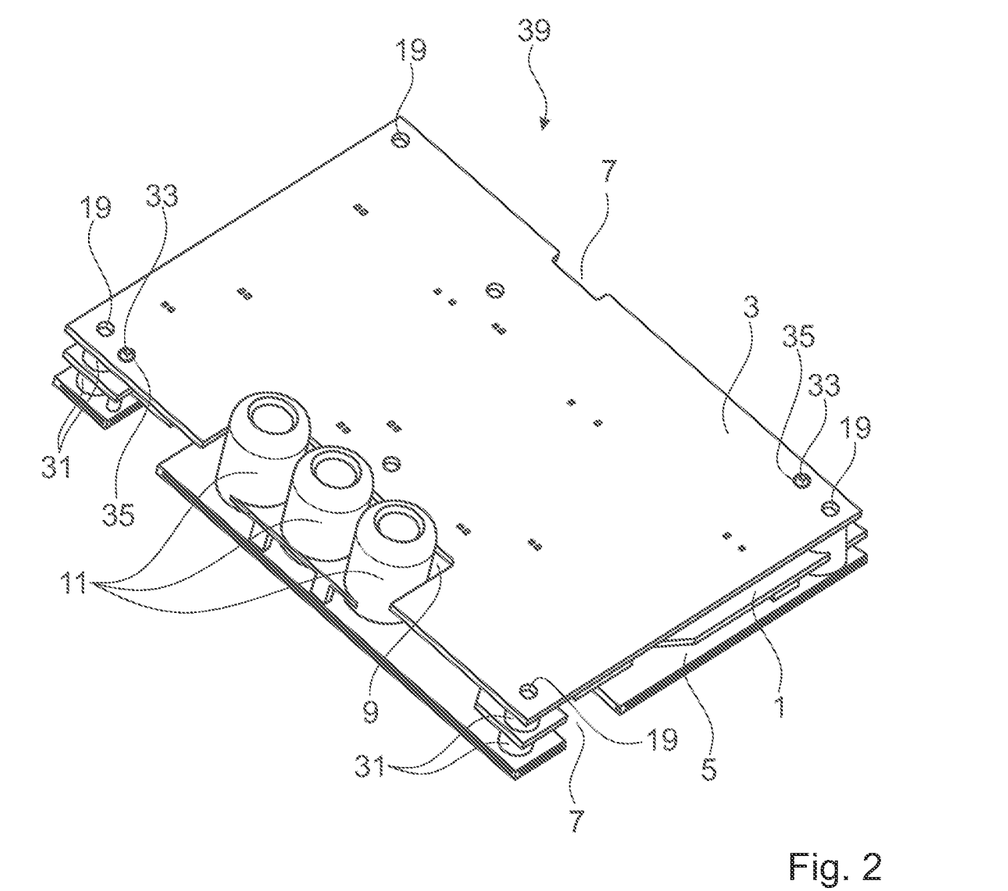
FIG. 2 shows a three-dimensional view of an exemplary embodiment of a printed circuit board arrangement.

The plate-like printed circuit board connecting device 1 is configured to connect a first printed circuit board 3 and a second printed circuit board 5 to one another, such that the printed circuit board connecting device 1 and the printed circuit boards 3, 5 extend in a substantially parallel manner and the connecting device 1 is arranged between the first and the second printed circuit board 3, 5. FIG. 1 illustrates the second printed circuit board 5 and the printed circuit board connecting device 1 with a view to their top sides. The first printed circuit board 3 is illustrated with a view to its bottom side. After mounting, in the subsequent printed circuit board arrangement which is illustrated in FIG. 2, the printed circuit board connecting device 1 is positioned between the bottom side of the first printed circuit board 3 and the top side of the second printed circuit board 5, with the result that the top side of the connecting device 1 faces the first printed circuit board 3 and the bottom side of the connecting device 1 faces the second printed circuit board 3.

The first and second printed circuit boards 3, 5 shown in FIG. 1 each have a substrate on which conductor tracks (not illustrated in FIG. 1 for the sake of clarity) extend. In this exemplary embodiment, the second printed circuit board 5 is an IMS printed circuit board, "IMS" standing for "insulated metal substrate" and being a metal core printed circuit board. Such an IMS printed circuit board is well suited for heat dissipation. The first printed circuit board 3 is configured as an FR4 printed circuit board, the substrate of which is formed from a composite material of FR4 class that is hardly inflammable and flame-retardant.

The first printed circuit board 3 has a rectangular base area with at least one edge-side cutout 7 for subsequent installation in a housing and an edge-side cutout 9 for projecting regions of the printed circuit board connecting device 1, the projecting regions being configured as connectors 11. The first printed circuit board 3 also has, on its bottom side, a plurality of interfaces 13 which are configured as female multipoint connectors. In various embodiments, the female multipoint connectors are provided with a different number of sockets 15. The sockets 15 are configured to fix plug pins 25 and to form a conductive connection with them. There are various exemplary embodiments of female multipoint connectors: one has for example 2×2 sockets which are arranged in a matrix form; another one has for example 2×3 sockets which are arranged in a matrix form; and yet another one has for example 2×7 sockets which are arranged in a matrix form. Although there are no further components 17 provided on the first printed circuit board 3, there are alternative exemplary embodiments having further components, for example chips, on the first printed circuit board 3.

The second printed circuit board 5 has a rectangular base area with edge-side cutouts 7 for subsequent installation in the housing. A plurality of electrical components 17, in particular chips, are fastened to a top side of the second printed circuit board 5 and connected in an electrically conducting manner via conductor tracks (not illustrated in FIG. 1 for the sake of clarity). The components 17 may be fixed for example by solder connections and be connected in an electrically conducting manner to the conductor tracks. As an alternative or in addition, connector bases, in which the components 17 are plugged and force-fittingly fixed, may be provided on the second printed circuit board 5. Interfaces 13 configured as female multipoint connectors are also provided on the top side of the second printed circuit board 5. The female multipoint connectors each have a plurality of grouped-together sockets 15, which are configured to fix plug pins 25 and to form a conductive connection with them. There are various exemplary embodiments of female multipoint connectors having a different number and arrangement of sockets 15.

The interfaces 13, which are configured as female multipoint connectors, of the first and second printed circuit boards 3, 5 are arranged such that the interfaces are situated opposite each other when the printed circuit boards 3, 5 are connected to one another. The corresponding, that is to say oppositely arranged interfaces 13 to be connected may advantageously but not necessarily be configured in the same way, that is to say with the same number and arrangement of sockets.

Both the first and the second printed circuit board 3, 5 have holes 19 in the corner regions, through which, in the subsequent printed circuit board arrangement, connecting means, for example screws, additionally fix the printed circuit boards 3, 5 which are then connected to one another.

The printed circuit board connecting device 1 has a plate 21 made of a non-conductive, insulating material and having a top side and a bottom side. A plurality of interface connections 23 are arranged in the plate 21 so as to be spaced apart from one another. Each interface connection 23 is configured to connect two corresponding interfaces 13 to one another. In this exemplary embodiment, the interface connection 23 is configured as a pin header which is integrated in the plate 21 and the plug pins 25 of which extend on opposite sides so that they project upwardly and downwardly. The number of plug pins 25 and their arrangement advantageously corresponds to the sockets 15 of the corresponding interfaces 13 on the first and second printed circuit boards 3, 5, which are intended to be connected. As an alternative, it is also possible for plug pins 25 to be provided only for some of the sockets 15 of the corresponding interfaces 13. The plug pins 25 of an interface connection 23 are end regions, which protrude beyond the top side and bottom side of the plate 21, of grouped-together conductors 41 which extend through the plate 21. The conductors 41 are consequently configured as pin contacts. The plug pins 25 can be fixed in the sockets 15, with the result that the conductors 41 form both a mechanical and an electrical connection between the printed circuit boards 3, 5. The interface connections 23 are each defined by an upwardly and downwardly projecting base 27 in the plate 21, the conductors 41 being grouped together in the base. The base 27 is a thickened portion of the plate 21 on the top side and bottom side and has a rectangular contour. The base 27 forms a stop for the interface 13.

The printed circuit board connecting device 1 has, in two corner regions, metallic sleeves 29 which extend through the plate 21 and which are laterally surrounded by the plate material. These sleeves 29 form, in the subsequent printed circuit board arrangement 39, an electrically conductive connection between the printed circuit boards 3, 5 which serves to ground the subsequent printed circuit board arrangement 39 so that it can be installed in an electromagnetically compatible manner. Each metallic sleeve 29 is positioned in such a way that when the printed circuit boards 3, 5 are connected, holes 19 in the printed circuit boards 3, 5 are arranged above and below the sleeve 29, such that a connecting means, for example a screw, can extend through the holes 19 and the sleeve 29 and thus form a part of the grounding arrangement, which can be connected to the housing.

Spacers 31, 33 on the plate 21, which project on the top side and/or on the bottom side, are an integral part of the plate 21. They define the distance between the printed circuit board connecting device 1 and the printed circuit boards 3, 5. In the corner regions, the spacers 31 are configured as hollow cylinders, and therefore connecting means can extend through the hollow cylinders. Further spacers 31, which are in the form of hollow cylinders in order to provide the printed circuit boards 3, 5 with a larger support region, do not necessarily have to have a continuous cutout between the upwardly and downwardly projecting regions of the hollow-cylindrical spacer 31. They may also project only in one direction, either downward or upward. As an alternative, the spacers may also be configured as pin-like spacers 33. The pin-like spacers 33 have a tapered head region which can engage in a corresponding cutout 35 or coding of the printed circuit board 3, 5, with the result that the spacers 33 additionally serve as aligning means in order to align and hold the printed circuit boards 3, 5 to be connected in a predefined position during mounting.

Dome-like regions at the edge of the printed circuit board connecting device 1 which have a continuous cutout are connectors 11 for cables, which are guided through the printed circuit board connecting device 1 to the second printed circuit board 5 and connected thereto in order to supply power to the subsequent printed circuit board arrangements 39. The position of these dome-like regions corresponds to the cutout 9 in the first printed circuit board 3. The connectors 11 are also an exemplary embodiment of an aligning means since they predefine the position of the first printed circuit board 3 and the printed circuit board connecting device 1.

The plate 21 of the printed circuit board connecting device 1 may have, for example edge-side, cutouts 37, in which components 17 on at least one of the printed circuit boards 3, 5 can extend through the printed circuit board connecting device 1. In this exemplary embodiment, the plate 21 has a comb-like contour, with cutouts 37 extending to a pronounced extent into the plate 21 and finger-like plate regions. Components 17 on the second printed circuit board 5 which project between the finger-like plate regions extend beyond the plate 21.

The plate 21 of the printed circuit board connecting device 1 is manufactured integrally from an insulating, non-conductive material, for example plastic. The printed circuit board connecting device 1 is configured as a plastics molded part, which has been manufactured as an injection-molded part, in which the conductors 41 of the interface connections 23 are encapsulated by the non-conductive plate material, with the result that a materially bonded connection between the conductors 41, which are configured as pin contacts, and the plate 21 is produced.

FIG. 2 shows a three-dimensional view of the printed circuit board arrangement 39 after successful mounting of the components 1, 3, 5 shown in FIG. 1. In the printed circuit board arrangement 39, the printed circuit board connecting device 1 is positioned between the bottom side of the first printed circuit board 3 and the top side of the second printed circuit board 5 and connects the first and the second printed circuit board 3, 5. Here, in contrast to FIG. 1, the view in FIG. 2 shows the first printed circuit board 3 with a view from above. The interface connections 23 of the printed circuit board connecting device 1 connect the corresponding interfaces 13 of the first and second printed circuit boards 3, 5, with the result that the conductors 41 both form a conductive connection and are fixed to the interfaces 13 of the printed circuit boards 3, 5 in a mechanical manner. This connection which is both electrical and mechanical is effected by way of the plug pins 25 and the sockets 15 in which the plug pins 25 are force-fittingly fixed. An additional fixing of the printed circuit boards 3, 5 in terms of their position is effected by way of four connecting means (not illustrated in FIG. 2), for example screws, in the corner regions, wherein the connecting means extend through the holes 19 of the printed circuit boards 3, 5 and the hollow spacers 31 or the metallic sleeves 29.

Figure 3:
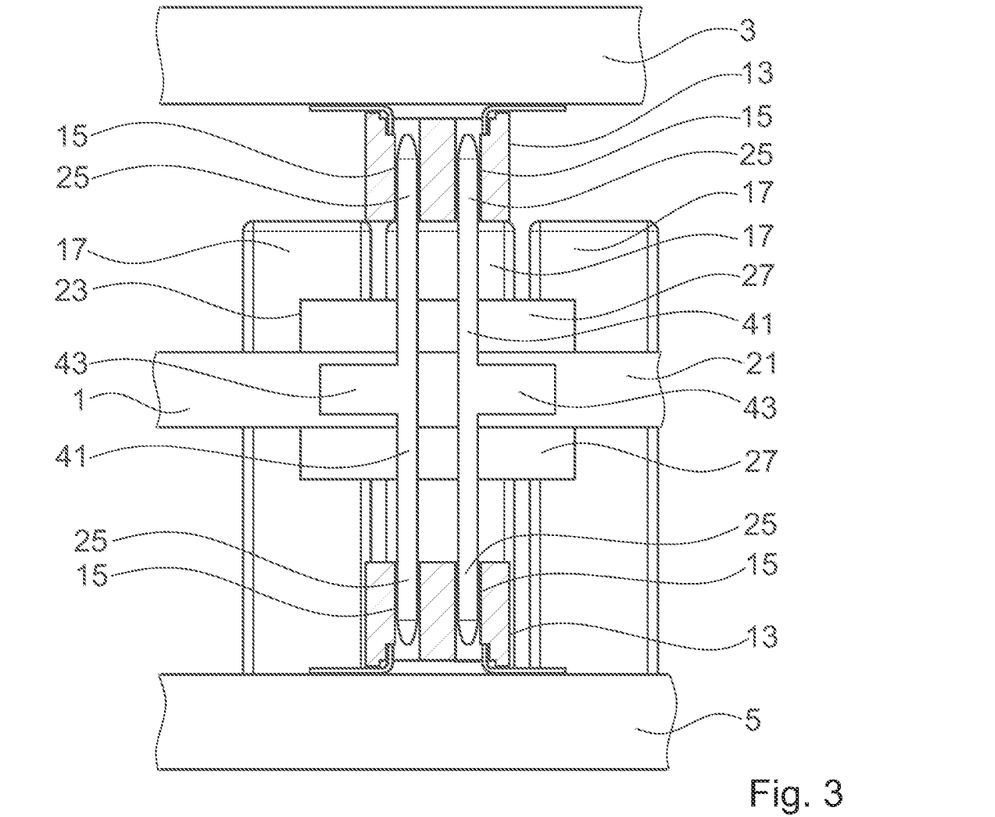
FIG. 3 shows a sectional view through a region of the printed circuit board arrangement.

FIG. 3 shows a section through a region of the printed circuit board arrangement 39, one of the interface connections 23 connecting the interfaces 13 of the printed circuit boards 3, 5 in the region. The interface connection 23 is arranged in one of the finger-like plate regions which extends in front of a component 17 projecting from the second printed circuit board 5. The interfaces 13 of the first and second printed circuit boards 3, 5 have sockets 15, into which the plug pins 25 of the interface connection 23 are introduced so that an electrically conductive connection to the sockets 15 is formed, which also fixes the plug pins 25.

The conductors 41, which are configured as pin contacts and the end regions of which protruding from the plate 21 form the plug pins 25, are configured in the form of bars and have pointed ends which make the introduction into the sockets 15 easier. The conductors 41 are widened in the middle region of the conductors 41, which is encapsulated by the plate material. In this exemplary embodiment, they have a flag-like widened portion 43. The widened portion, assisted by the projecting base 27 around the conductors 41, by means of which the plate 21 has a greater thickness in the region of the conductors 41, has the effect that a form-fitting connection of the conductor 41 to the plate 21 is produced during encapsulation.

Figure 4:
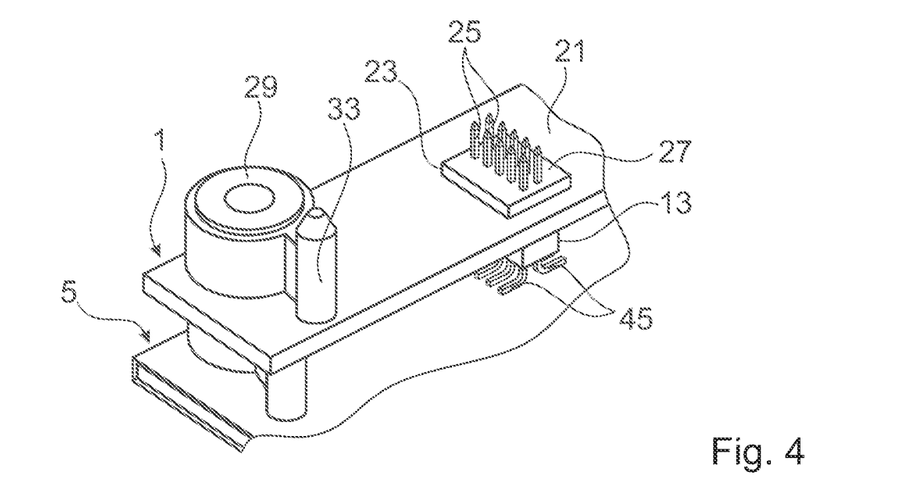
FIG. 4 shows a three-dimensional view of a detail of the printed circuit board arrangement.

FIG. 4 shows a three-dimensional view of a region of the printed circuit board arrangement 39 in an enlarged illustration.

In this exemplary embodiment, the contacting of the interface 13 on the second printed circuit board 5 is illustrated. The interface 13 configured as a female multipoint connector has solder contacts 45 which are connected to the second printed circuit board 5 by solder connections. The lower plug pins 25 of the interface connection 23 engage in the sockets 15 of the interface 13. The upper plug pins 25 are connected to sockets 15 of the first printed circuit board 3 (not illustrated in FIG. 4).

The features specified above and in the claims and shown in the figures can be advantageously implemented both individually and in various combinations. The invention is not restricted to the exemplary embodiments described, but may be modified in various ways within the scope of the abilities of a person skilled in the art.

What is claimed is:

1. A printed circuit board connecting device (1) for connecting a first and a second printed circuit board (3, 5), the printed circuit board connecting device (1) comprising:
a non-conductive plate (21) having a top side and a bottom side; and
a plurality of interface connections (23) which are arranged in the plate (21) so as to be spaced apart from one another,
wherein each interface connection (23) has grouped-together conductors (41) which extend through the non-conductive plate (21) and which are laterally enclosed by the non-conductive plate material and the end regions of which protruding on the top side and bottom side from the non-conductive plate (21) can be fixed to interfaces (13) of the first and second printed circuit boards (3, 5) to be connected, and therefore the conductors (41) form both a mechanical and an electrical connection between the interfaces (13) of the first and second printed circuit boards (3, 5),
wherein the interface connections (23) are each defined by a base (27) that protrudes on the top side of the non-conductive plate (21) and/or a base (27) that protrudes on the bottom side of the non-conductive plate (21),
wherein the base (27) is a thickened portion of the non-conductive plate (21) on its top side and/or bottom side,
wherein the end regions are configured as at least first and second bar-shaped plug pins (25) that are configured to be fixed in sockets (15) of the interfaces (13),
wherein the grouped-together conductors (41) have a widened portion (43) that is encapsulated by the non-conductive plate (21), and wherein the grouped together conductors (41) are connected to the non-conductive plate (21) in a form-fitted and/or materially bonded manner,
wherein the printed circuit board connecting device (1) is configured to be disposed between the first printed circuit board (3) and the second printed circuit board (5) in such a manner that the top side of the non-conductive plate (21) is configured to face a bottom side of the first printed circuit board (3) and the bottom side of the non-conductive plate (21) is configured to face a top side of the second printed circuit board (5), and wherein the printed circuit board connecting device (1) is configured to extend in a parallel manner with respect to the first and second printed circuit boards (3, 5), and
wherein the first bar-shaped plug pin (25) has a first surface having the widened portion (43) and the second bar-shaped plug pin (25) has a first surface having a second widened portion (43) facing away from the widened portion (43) of the first surface of the first bar-shaped plug pin (25), wherein the first bar-shaped plug pin (25) has a second surface facing opposite the first surface of the first bar-shaped plug pin (25) and the second bar-shaped plug pin (25) has a second surface facing the second surface of the first bar-shaped plug pin (25), and wherein the second surfaces of the first and second bar-shaped plug pins (25) are free of a widened portion such that the second surfaces of the first and second bar-shaped plug pins (25) are parallel to one another.

2. The printed circuit board connecting device (1) as claimed in claim 1,
wherein the non-conductive plate (21) is configured as an integral plastics molded part in which the conductors (41) are encapsulated.

3. The printed circuit board connecting device (1) as claimed in claim 1,
also comprising a metallic sleeve (29) which extends through the non-conductive plate (21).

4. The printed circuit board connecting device (1) as claimed in claim 1,
wherein the non-conductive plate (21) has spacers (31, 33) which protrude on the top side and/or on the bottom side.

5. The printed circuit board connecting device (1) as claimed in claim 1,
wherein the non-conductive plate (21) comprises, on the top side and/or bottom side, aligning means which are configured to align at least one of the first and second printed circuit boards (3, 5) to be connected in a predefined position.

6. A printed circuit board arrangement (39) comprising:
a first and a second printed circuit board (3, 5); and
a printed circuit board connecting device (1) comprising,
a non-conductive plate (21) having a top side and a bottom side; and
a plurality of interface connections (23) which are arranged in the non-conductive plate (21) so as to be spaced apart from one another,
wherein each interface connection (23) has grouped-together conductors (41) which extend through the non-conductive plate (21) and which are laterally enclosed by the non-conductive plate material and the end regions of which protruding on the top side and the bottom side from the non-conductive plate (21) are fixed to interfaces (13) of the first and second printed circuit boards (3, 5), and therefore the conductors (41) form both a mechanical and an electrical connection between the interfaces (13) of the first and second printed circuit boards (3, 5),
wherein the interface connections (23) are each defined by a base (27) that protrudes on the top side of the non-conductive plate (21) and/or a base (27) that protrudes on the bottom side of the non-conductive plate (21),
wherein the base (27) is a thickened portion of the non-conductive plate (21) on its top side and/or bottom side,
wherein the end regions are configured as at least first and second bar-shaped plug pins (25) that are fixed in sockets (15) of the interfaces (13),
wherein the grouped-together conductors (41) have a widened portion (43) that is encapsulated by the non-conductive plate (21), and wherein the grouped together conductors (41) are connected to the non-conductive plate (21) in a form-fitted and/or materially bonded manner,
wherein the printed circuit board connecting device (1) connects a bottom side of the first printed circuit board (3) arranged on the top side of the non-conductive plate (21) to a top side of the second printed circuit board (5) arranged on the bottom side of the non-conductive plate (21),
wherein the printed circuit board connecting device (1) is disposed between the first printed circuit board (3) and the second printed circuit board (5) in such a manner that the top side of the non-conductive plate (21) faces the bottom side of the first printed circuit board (3) and the bottom side of the non-conductive plate (21) faces a top side of the second printed circuit board (5), and wherein the printed circuit board connecting device (1) extends in a parallel manner with respect to the first and second printed circuit board (3, 5), and wherein the first bar-shaped plug pin (25) has a first surface having the widened portion (43) and the second bar-shaped plug pin (25) has a first surface having a second widened portion (43) facing away from the widened portion (43) of the first surface of the first bar-shaped plug pin (25), wherein the first bar-shaped plug pin (25) has a second surface facing opposite the first surface of the first bar-shaped plug pin (25) and the second bar-shaped plug pin (25) has a second surface facing the second surface of the first bar-shaped plug pin (25), and wherein the second surfaces of the first and second bar-shaped plug pins (25) are free of a widened portion such that the second surfaces of the first and second bar-shaped plug pins (25) are parallel to one another.

7. The printed circuit board arrangement (39) as claimed in claim 6,
wherein at least one of the first and second printed circuit boards (3, 5) is configured as an IMS printed circuit board.

8. The printed circuit board arrangement (39) as claimed in claim 6,
wherein at least one of the first and second printed circuit boards (3, 5) is configured as an FR4 printed circuit board.

9. The printed circuit board arrangement (39) as claimed in claim 7,
wherein at least one of the first and second printed circuit boards (3, 5) is configured as an FR4 printed circuit board.

10. The printed circuit board arrangement (39) as claimed in claim 6,
wherein the printed circuit boards (3, 5) have interfaces (13) which are connected to the interface connections (23), and therefore the conductors (41) form both a mechanical and an electrical connection between the interfaces (13) of the first and second printed circuit boards (3, 5).

11. The printed circuit board arrangement (39) as claimed in claim 6,
wherein the first and second printed circuit boards (3, 5) have holes (19) whose position corresponds to the position of a sleeve (29) of the printed circuit board connecting device (1), and the holes (19) and the sleeve (29) are configured such that a connecting means can be positioned in the holes (19) and the sleeve (29).

12. The printed circuit board arrangement (39) as claimed in claim 6,
wherein at least one of the first and second printed circuit boards (3, 5) has a component (17) which projects in the direction of the printed circuit board connecting device (1) and which extends through a cutout (7) in the printed circuit board connecting device (1).

* * * * *